(12) United States Patent
Matache et al.

(10) Patent No.: US 8,675,783 B1
(45) Date of Patent: Mar. 18, 2014

(54) LOW COMPLEXITY DISTANCE METRICS FOR MAXIMUM LIKELIHOOD RECEIVERS

(75) Inventors: Adina Matache, Redondo Beach, CA (US); Leilei Song, Sunnyvale, CA (US); Bhaskar V. Nallapureddy, Sunnyvale, CA (US); Hui-Ling Lou, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/309,684

(22) Filed: Dec. 2, 2011

Related U.S. Application Data

(60) Provisional application No. 61/419,184, filed on Dec. 2, 2010.

(51) Int. Cl.
  *H04L 27/06* (2006.01)
  *H04L 27/00* (2006.01)
(52) U.S. Cl.
  USPC ........... 375/341; 375/267; 375/340; 375/260; 375/316; 375/259
(58) Field of Classification Search
  USPC .................. 375/341, 267, 340, 260; 714/780
  See application file for complete search history.

(56) References Cited

U.S. PATENT DOCUMENTS

| | | | |
|---|---|---|---|
| 7,746,951 B2 | 6/2010 | Hwang et al. | |
| 2008/0225976 A1 | 9/2008 | Prasad et al. | |
| 2009/0190676 A1* | 7/2009 | Nissani (Nissensohn) | ... 375/260 |
| 2010/0002751 A1 | 1/2010 | Dent | |
| 2010/0091912 A1* | 4/2010 | Park et al. | ...... 375/341 |
| 2010/0183065 A1* | 7/2010 | Siti et al. | ........ 375/233 |
| 2010/0232549 A1* | 9/2010 | Oizumi | .......... 375/341 |

OTHER PUBLICATIONS

Lee et al., "Soft MIMO ML Demodulation Based on Bitwise Constellation Partitioning," Oct. 2009, IEEE Communication Letters, vol. 13, No. 10, pp. 736-738.*
Duman et al., Coding for MIMO Communication Systems, 2007, John Wiley & Sons Ltd., p. 82.*
Mujtaba, Syed Aon, TGn Sync Proposal Technical Specification, May 18, 2005, IEEE 802.11-04/0889r6, Institute of Electrical and Electronics Engineers, Inc., New York, NY.
LAN/MAN Standards Committee of the IEEE Computer Society, Part 16: Air Interface for Fixed and Mobile Broadband Wireless Access Systems, Feb. 28, 2006, IEEE Std. P802.16e, Institute of Electrical and Electronics Engineers, Inc., New York, New York.
Office Action dated Dec. 5, 2013 in related/corresponding U.S. Appl. No. 13/672,141 filed Nov. 8, 2012.

* cited by examiner

*Primary Examiner* — Chieh M Fan
*Assistant Examiner* — Michelle M Koeth

(57) ABSTRACT

Systems and methods are provided for determining a data value for a bit of interest in a received data signal. A closest 0-bit symbol candidate is selected from a plurality of 0-bit symbol candidates using a symbol selection distance approximation. A closest 1-bit symbol candidate is selected from a plurality of 1-bit symbol candidates using the symbol selection distance approximation. A 0-bit distance between the received data signal and the selected 0-bit symbol candidate is determined, and a 1-bit distance between the received data signal and the selected 1-bit symbol candidate is determined. A log likelihood ratio is calculated for the bit of interest using the determined 0-bit distance and the determined 1-bit distance.

28 Claims, 13 Drawing Sheets

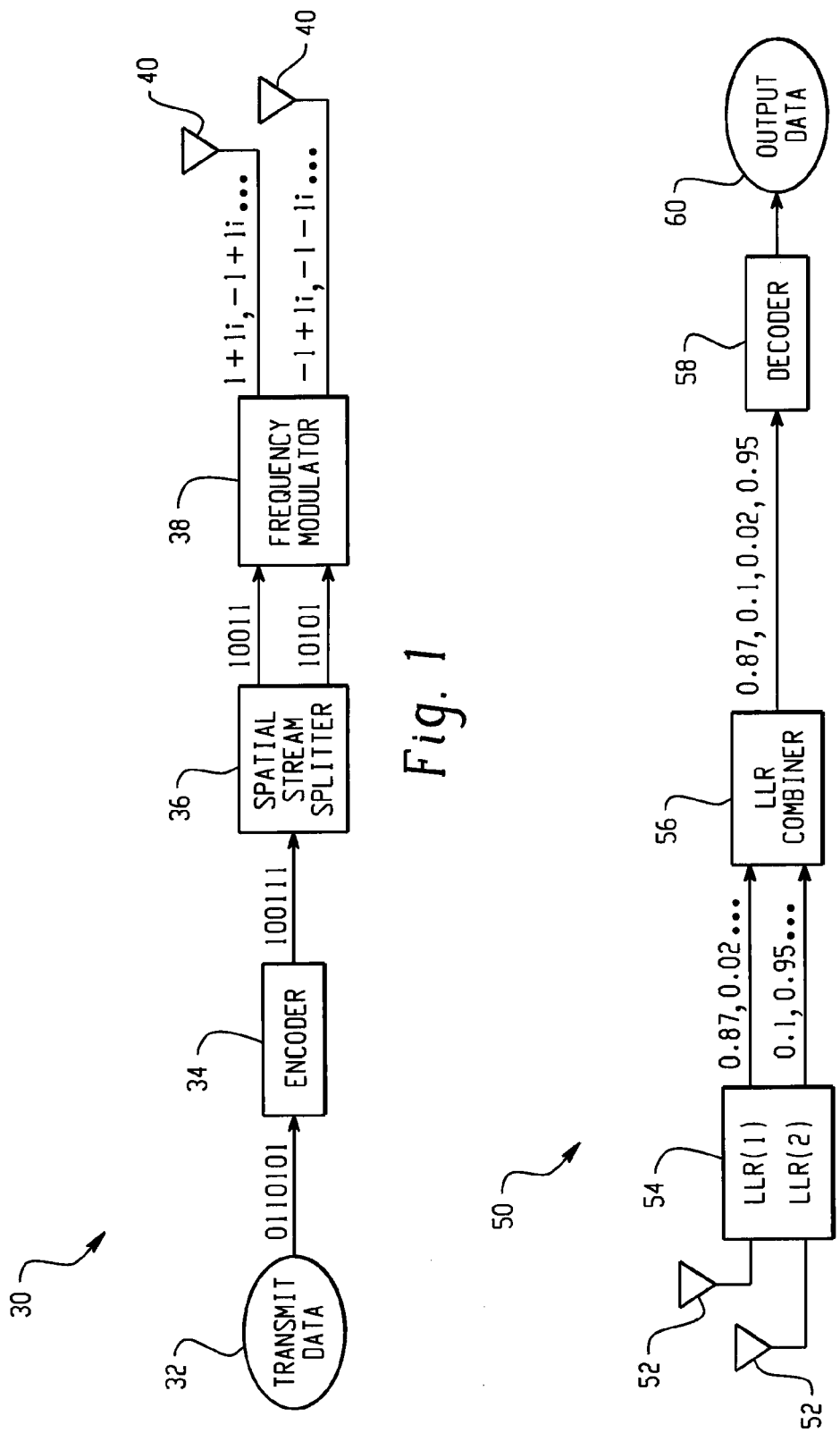

LOW COMPLEXITY DISTANCE METRICS FOR MAXIMUM LIKELIHOOD RECEIVERS

CROSS-REFERENCE TO RELATED APPLICATIONS

This disclosure claims priority from U.S. Provisional Patent Application No. 61/419,184, filed on Dec. 2, 2010, the entirety of which is incorporated herein by reference.

This disclosure is related to U.S. patent application Ser. No. 12/406,587, filed on Mar. 18, 2009, the entirety of which is incorporated herein by reference.

FIELD

The technology described in this patent document relates generally to signal receivers, and more particularly to likelihood ratio computation in signal receivers.

BACKGROUND

Multiple transmit/multiple receive (MIMO) antennas may be used to enhance communication data rates in standards that allow more than one spatial stream to be transmitted, such as WLAN (IEEE 802.11n), WiMax (IEEE 802.16e), 3GPP LTE, etc. FIG. 1 is a block diagram 30 of a two spatial stream transmitter configuration example. Transmit data 32 is provided as a stream of 1's and 0's to an encoder 34. The encoder 34 encodes the transmit data 32 with, for example, an error correcting code. The output of the encoder 34 is provided to a spatial stream splitter 36, which divides the bit stream from the encoder 34 into two spatial streams in some order. The two spatial streams are then propagated to a frequency modulator 38 which modulates the streams into symbols, which may be represented as a sequence of complex numbers. The frequency modulated signals are sent through a transmission channel, such as through the air, via one or more antennas 40.

Efficient detection/equalization of the transmitted signals is central to a MIMO receiver. FIG. 2 is a block diagram of a two spatial stream receiver configuration example. Multiple spatial stream signals are received, such as via one or more antennas 52, from the transmission channel. The received multiple spatial stream signals may be represented by the equation: $y_k = H_{Hk} + w$, where $y_k$ represents an N×1 vector of received signals over N receive antennas at time k, H is a complex-valued N×2 matrix that represents a channel matrix identifying the combined effects of the transmission channel and spatial mapping of the transmitter on the transmitted signal, $x_k$ is an 2×1 vector that represents the transmitted data values that are sought to be recovered, and w represents noise. The above relationship pertains to a single frequency in a frequency-flat fading single-carrier modulated system or, alternatively, applies to individual frequency subcarriers or tones in an orthogonal frequency division multiplexing (OFDM) or similarly modulated system. The received multiple spatial streams are propagated to an equalizer/receiver 54 which calculates log-likelihood ratios (LLR(1) and LLR (2)) for each of the received spatial streams. The calculated log-likelihood ratios are ordered and combined by a log-likelihood ratio combiner 56 and made available to a decoder 58. The decoder 58 decodes the data received from the combiner 56 and generates output data 60.

In a two spatial stream system, each data symbol received, $x_i$, where i=1 corresponds to data transmitted on a first spatial stream, and i=2 corresponds to data transmitted on a second spatial stream, maps to n bits $\{b_1^{(i)}, b_2^{(i)}, \ldots, b_n^{(i)}\}$. $M = 2^n$ is the alphabet size of the underlying modulation, such as binary phase shift keying (BPSK), quadrature amplitude modulation (QAM), etc., and the set of all possible scalar constellation points may be represented by A. The log-likelihood ratio (LLR) for a bit $b_k^{(i)}$ given a received vector y and a known channel matrix H may be represented as:

$$L(b_k^{(i)}) = \log\frac{P(b_k^{(i)}=1)}{P(b_k^{(i)}=0)} = \log\left\{\left(\sum_{x \in \chi_{k,i}} e^{-\|y-Hx\|^2/2\sigma^2}\right) \Big/ \left(\sum_{x \in \bar{\chi}_{k,i}} e^{-\|y-Hx\|^2/2\sigma^2}\right)\right\},$$

where $\chi_{k,i}$ is the set of all possible x vectors with $b_k^{(i)} = 1$, and $\bar{\chi}_{k,i}$ is the set of all possible x vectors with $b_k^{(i)} = 0$. In practice, the following simplification, called the Max-Log Approximation, is utilized:

$$L(b_k^{(i)}) \approx \min_{x \in \chi_{k,i}} \|y - Hx\|^2 - \min_{x \in \bar{\chi}_{k,i}} \|y - Hx\|^2.$$

There are several existing systems for detecting/equalizing received signals in multiple spatial stream systems. FIG. 3A is a block diagram 70 of a log-likelihood ratio calculator 72 that utilizes a linear equalizer 74. The linear equalizer 74 receives, via one or more antennas 76, a multi-spatial stream signal that has been transmitted through a channel and outputs a stream of log-likelihood ratios based on the received signals. For example, a zero-forcing equalizer is a linear equalizer that may be utilized, as illustrated in FIG. 3A. The zero-forcing equalizer seeks to recover the transmitted data values, $x_k$, from the received signal, $y_k$, that are modeled as, $y_k = H_{xk} + w$, by assuming the noise vector is zero. Having an estimated channel effect matrix, H, enables $x_k$ to be recovered from the received signal, $y_k$, as the data values are the only unknown remaining. While the zero-forcing equalizer has a simple design, not taking the noise term into consideration makes the method sub-optimal.

FIG. 3B is a block diagram 80 of a log-likelihood ratio calculator 82 that utilizes a maximum-likelihood receiver 84. The maximum-likelihood receiver 84 receives a multi-spatial signal that has been transmitted through a channel, such as through the air, via one or more antennas 86, and outputs a stream of log-likelihood ratios based on the received signals. The maximum-likelihood receiver 84 is superior to most linear equalizers in error performance. However, maximum-likelihood receivers tend to be highly complex, such as having a complexity that grows exponentially with the number of spatial streams associated with the system.

FIG. 4A is a block diagram 100 of a maximum-likelihood receiver 102 that utilizes an exhaustive search methodology 104. The exhaustive search module 104 receives, via one or more antennas 106, a multi-spatial signal that has been transmitted through a channel and outputs a stream of log-likelihood ratios based on the received signals. In the exhaustive search methodology 104, the maximum likelihood receiver computes $\|y - Hx\|^2$ for all possible values of x. In a two spatial stream system, this results in $M^2$ total distance computations. The maximum-likelihood receiver then computes log-likelihood ratios accordingly.

FIG. 4B is a diagram illustrating exemplary calculations for the exhaustive search methodology in a QPSK, 2-spatial-stream setting. A real/imaginary plot of a received signal is shown at 112. The exhaustive search methodology calculates the distance term, $\|y - Hx\|^2$, for each of the constellation points. FIG. 4B illustrates only six of the distance calculations 114 to six of the constellation points 116 for ease in viewing. However, the exhaustive search method would process distance calculations for all of the 16 constellation points resulting in 16 distance terms to be considered in calculating an LLR. This problem is further exacerbated in popular, more complex encoding schemes such as 16-QAM, which would require 256 distance calculations with 256 distance terms to be considered in calculating an LLR. This order $M^2$, $O(M^2)$, complexity may introduce a significant bottleneck into the receiver system.

FIG. 5A is a block diagram 120 of a maximum-likelihood receiver 122 that utilizes a sphere decoding simplification 124. The sphere decoding methodology 124 receives a multi-spatial signal that has been transmitted through a channel, such as through the air, via one or more antennas 126, and outputs a stream of log-likelihood ratios based on the received signals. The sphere decoding methodology 124 seeks to simplify the complexity of the exhaustive search by limiting the amount of constellation points to which distance calculations are made and, consequently, the number of distance terms to be considered in calculating an LLR. FIG. 5B is a diagram 130 illustrating the sphere decoding simplification. In the sphere decoding technique, distance values, $\|y-Hx\|^2$, are only computed for those x such that Hx lies inside a sphere of radius D centered around the received signal, y (i.e., for x such that $\|y-Hx\|^2 \le D^2$). A real/imaginary plot of a received signal is shown at 132. As illustrated in FIG. 5B, the limitation of distance calculations 136 to constellation points 138 within a radius D 134 reduces the number of distance calculations and terms to be considered in LLR calculation to four. While this simplification may offer significant processing savings, it may have a detrimental effect on error performance. Because the set of constellation points 138 within radius D may not have constituent 1s and 0s at every bit location, as is evident in the first bit position where all four constellation points 138 contain '0's at the first position, the LLR calculation formulas described above may have insufficient data to correctly calculate an LLR (e.g., the Max Log Approximation would not have any terms in $x \in x_{k,i}$ from which to select a minimum).

SUMMARY

In accordance with the teachings provided herein, systems and methods are provided for determining a data value for a bit of interest in a received data signal. A closest 0-bit symbol candidate is selected from a plurality of 0-bit symbol candidates using a symbol selection distance approximation. Selecting a closest 0-bit symbol candidate includes determining a first distance between a received data signal and each of the plurality of 0-bit symbol candidates, where the first distance is determined using the symbol selection distance approximation and selecting one of the 0-bit symbol candidates based on the determined first distances. A closest 1-bit symbol candidate is selected from a plurality of 1-bit symbol candidates using the symbol selection distance approximation. Selecting a closest 1-bit symbol candidate includes determining a second distance between the received data signal and each of the plurality of 1-bit symbol candidates, where the second distance is determined using the symbol selection distance approximation and selecting one of the 1-bit symbol candidates based on the determined second distances. A 0-bit distance is determined between the received data signal and the selected 0-bit symbol candidate, and a 1-bit distance between the received data signal and the selected 1-bit symbol candidate determined. A log likelihood ratio for the bit of interest is calculated using the determined 0-bit distance and the determined 1-bit distance.

As another example, a computer-implemented system for determining a data value for a bit of interest in a received data signal may include one or more data processors and a computer-readable medium encoded with instructions for commanding the one or more data processors to execute a method. In the method, a closest 0-bit symbol candidate is selected from a plurality of 0-bit symbol candidates using a symbol selection distance approximation. Selecting a closest 0-bit symbol candidate includes determining a first distance between a received data signal and each of the plurality of 0-bit symbol candidates, where the first distance is determined using the symbol selection distance approximation and selecting one of the 0-bit symbol candidates based on the determined first distances. A closest 1-bit symbol candidate is selected from a plurality of 1-bit symbol candidates using the symbol selection distance approximation. Selecting a closest 1-bit symbol candidate includes determining a second distance between the received data signal and each of the plurality of 1-bit symbol candidates, where the second distance is determined using the symbol selection distance approximation and selecting one of the 1-bit symbol candidates based on the determined second distances. A 0-bit distance is determined between the received data signal and the selected 0-bit symbol candidate, and a 1-bit distance between the received data signal and the selected 1-bit symbol candidate determined. A log likelihood ratio for the bit of interest is calculated using the determined 0-bit distance and the determined 1-bit distance.

As a further example, a computer-readable medium is encoded with instructions for commanding one or more data processors to execute a method for determining a data value for a bit of interest in a received data signal. In the method, a closest 0-bit symbol candidate is selected from a plurality of 0-bit symbol candidates using a symbol selection distance approximation. Selecting a closest 0-bit symbol candidate includes determining a first distance between a received data signal and each of the plurality of 0-bit symbol candidates, where the first distance is determined using the symbol selection distance approximation and selecting one of the 0-bit symbol candidates based on the determined first distances. A closest 1-bit symbol candidate is selected from a plurality of 1-bit symbol candidates using the symbol selection distance approximation. Selecting a closest 1-bit symbol candidate includes determining a second distance between the received data signal and each of the plurality of 1-bit symbol candidates, where the second distance is determined using the symbol selection distance approximation and selecting one of the 1-bit symbol candidates based on the determined second distances. A 0-bit distance is determined between the received data signal and the selected 0-bit symbol candidate, and a 1-bit distance between the received data signal and the selected 1-bit symbol candidate determined. A log likelihood ratio for the bit of interest is calculated using the determined 0-bit distance and the determined 1-bit distance.

BRIEF DESCRIPTION OF THE DRAWINGS

FIG. 1 is a block diagram of a multiple spatial stream transmitter configuration.

FIG. 2 is a block diagram of a multiple spatial stream receiver configuration.

DETAILED DESCRIPTION

Figure 3A:
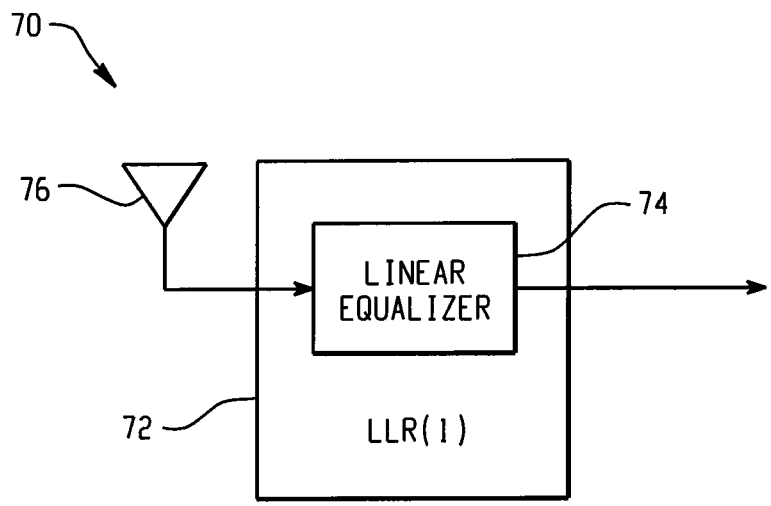
FIG. 3A is a block diagram of a log-likelihood ratio calculator that utilizes a linear equalizer.
Figure 3B:
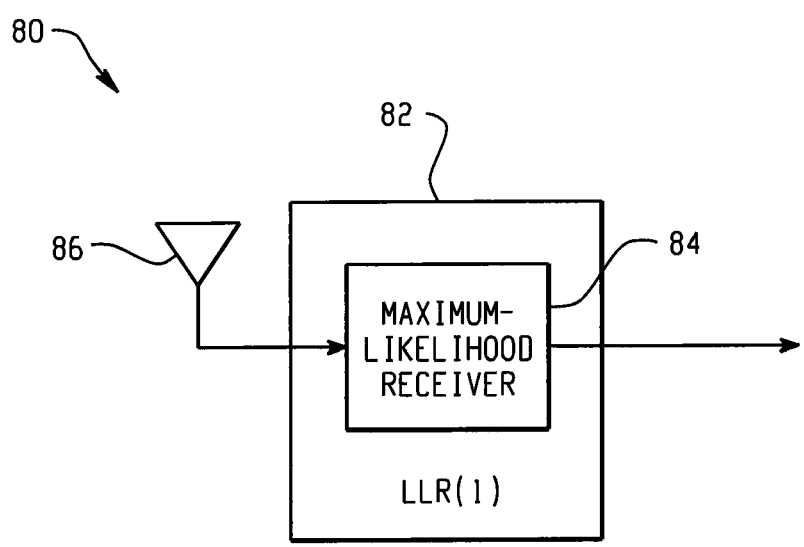
FIG. 3B is a block diagram of a log-likelihood ratio calculator that utilizes a maximum-likelihood receiver.
Figure 4A:
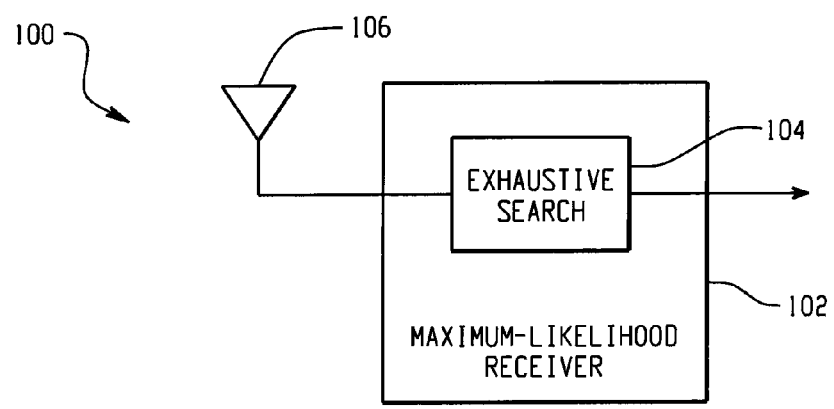
FIG. 4A is a block diagram of a maximum-likelihood receiver that utilizes an exhaustive search methodology.
Figure 4B:
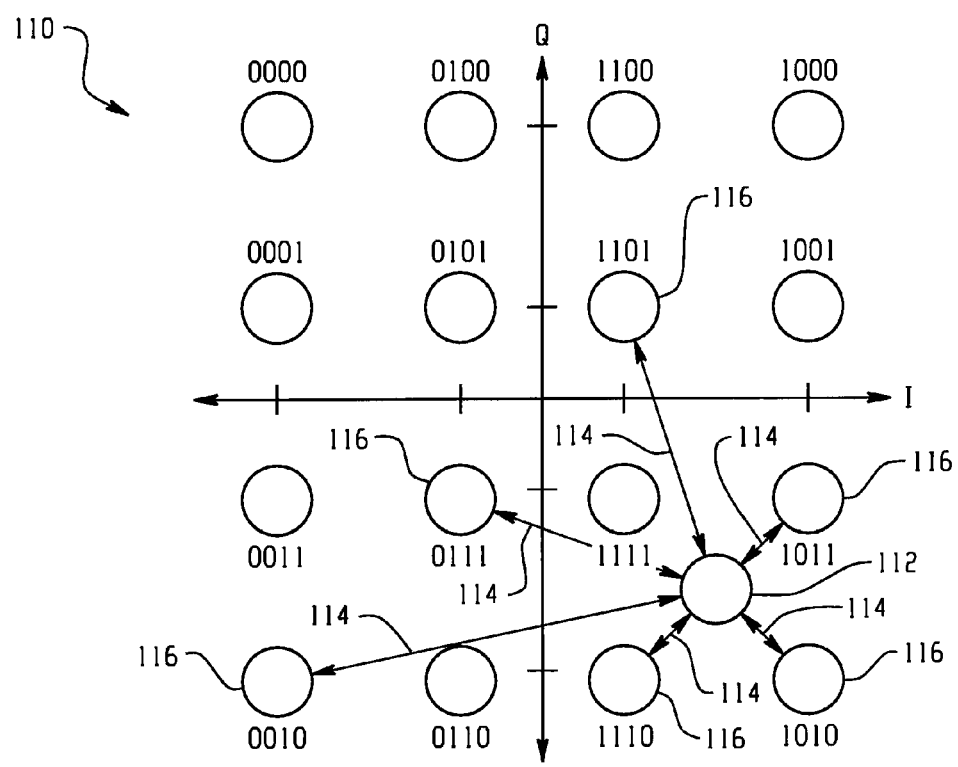
FIG. 4B is a diagram illustrating exemplary calculations for the exhaustive search methodology.
Figure 5A:
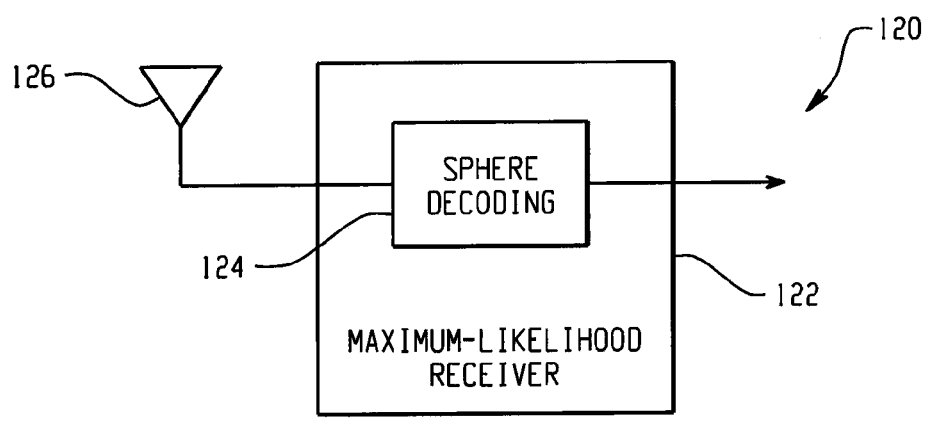
FIG. 5A is a block diagram of a maximum-likelihood receiver that utilizes a sphere decoding simplification.
Figure 5B:
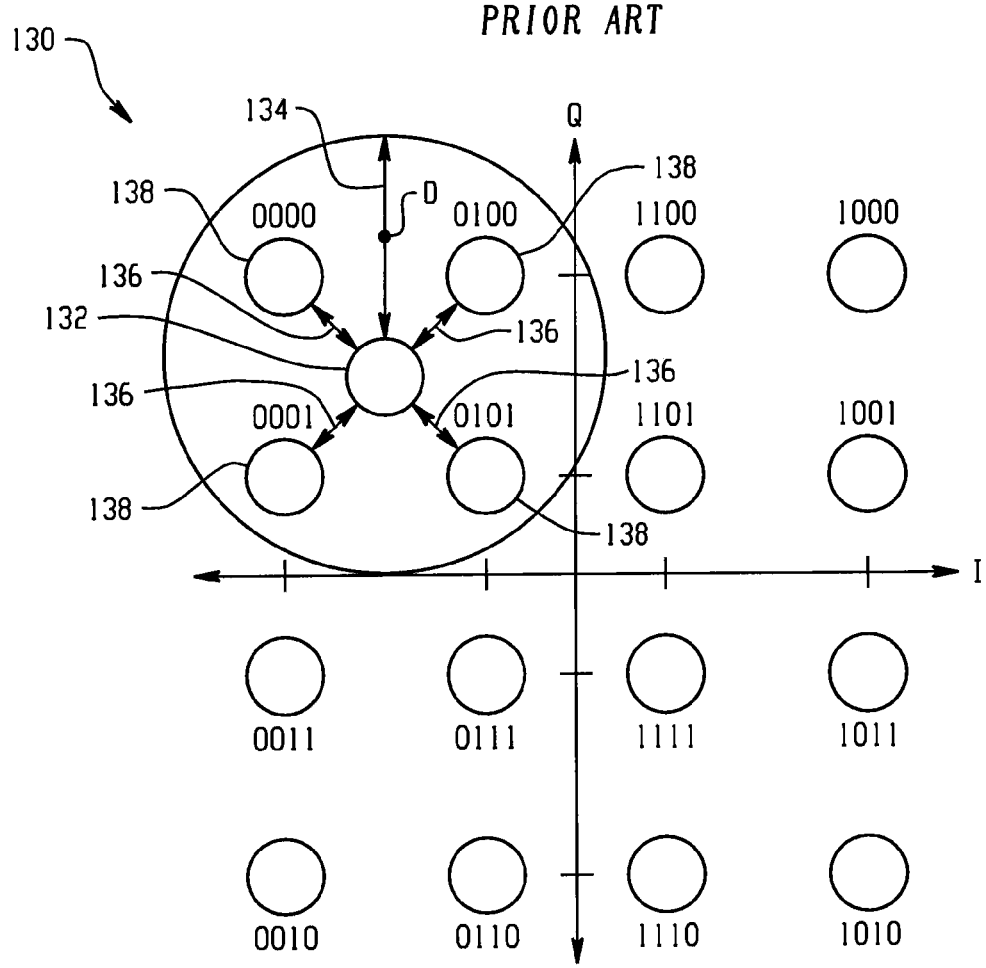
FIG. 5B is a diagram illustrating the sphere decoding simplification.

As noted above in discussing FIG. 4A, a maximum-likelihood receiver that implements an exhaustive search methodology tends to become highly complex as the number of spatial streams associated with the system increases. Such complexity may increase exponentially. Because an increased number of spatial streams can have a positive effect on achievable data rates, mitigation of these complexity increases is desirable.

Figure 6:
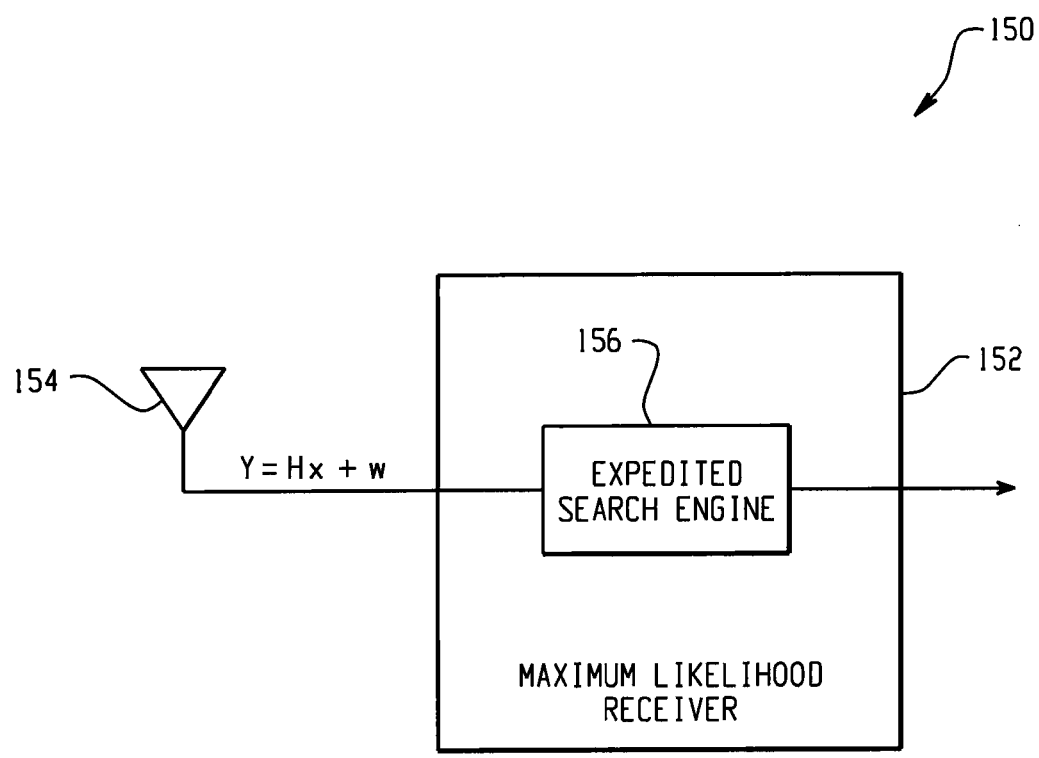
FIG. 6 is a block diagram depicting a maximum likelihood receiver that implements an expedited search methodology.

FIG. 6 is a block diagram depicting a maximum likelihood receiver that implements an expedited search methodology. A maximum likelihood receiver 152 receives a data signal via an antenna 154. The received data signal is provided to an expedited search engine 156 as part of a process of determining whether bits transmitted in the received data signal represent 0's or 1's. The expedited search engine 156 executes a modified exhaustive search of all possible symbols that could be portrayed by the received data signal and uses the results of that search to calculate a log likelihood ratio, which can be used to determine whether a particular bit of data in the received data signal should be considered a 0 or a 1.

Figure 7:
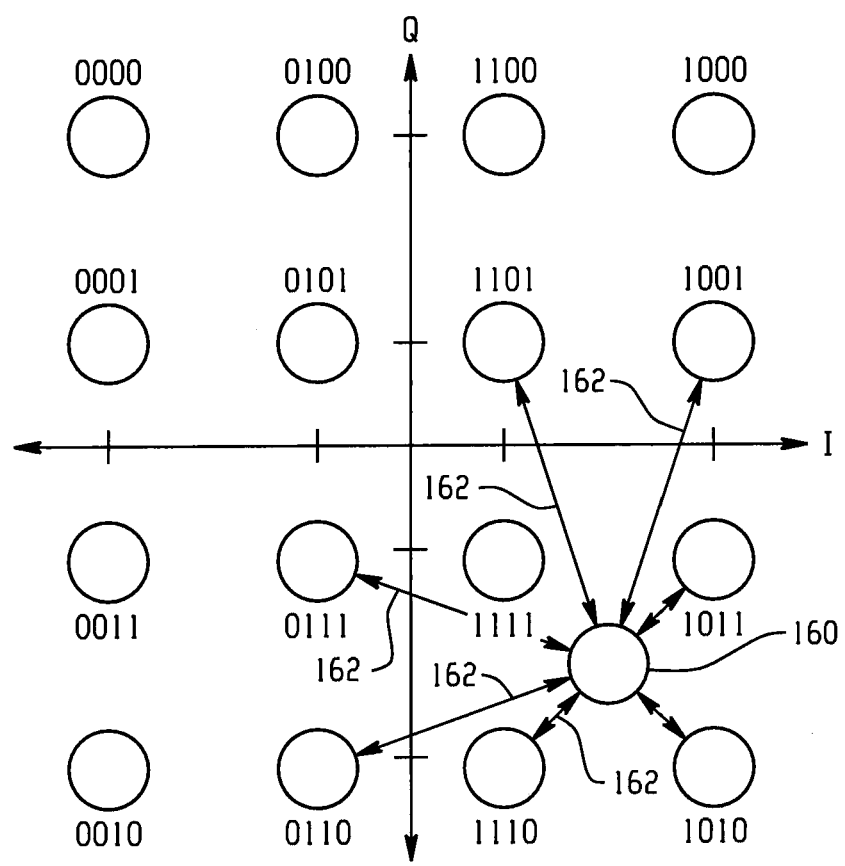
FIG. 7 is a diagram depicting exemplary distance calculations made by the expedited search engine.

FIG. 7 is a diagram depicting exemplary distance calculations made by the expedited search engine. A real/imaginary plot of a received signal is shown at 160. The expedited search engine calculates a distance, for each of the constellation points, which represent symbols associated with a series of bit values. FIG. 7 illustrates only eight of the distance calculations 162 for ease in viewing. The distance calculations are made to identify two of the constellation points that are to be used in calculating the log likelihood ratio. The expedited search engine seeks to find the closest symbol candidate having a 0 at the bit of interest and the closest symbol candidate having a 1 at the bit of interest. Thus, when determining whether the first bit of a symbol for a received signal is a 0 or 1, the expedited search engine attempts to identify the closest symbol candidate that has a 0 as its first bit and the closest symbol candidate that has a 1 as its first bit. When determining whether the second bit of a symbol for a received signal is a 0 or 1, the expedited search engine attempts to identify the closest symbol candidate that has a 0 as its second bit and the closest symbol candidate that has a 1 as its second bit.

Traditional exhaustive search methodologies utilize an exact distance solving algorithm (e.g., a squared Euclidean distance calculation) in calculating a distance between the received signal and the symbol candidates. Such an exact distance solving algorithm is computational complex and time consuming. The example of FIG. 7 includes only 16 possible candidate signals, but as the number of available candidate symbols increases, the cost of the exact distance solving algorithm that is calculated for each received signal symbol quickly increases.

To combat the cost of performing an exact distance calculation from the received signal symbol to each of the candidate symbols, the expedited search engine utilizes a symbol selection distance approximation algorithm to calculate the distances 162. By performing a faster, although potentially less accurate distance determination during the search step, performance in identifying and selecting 0-bit symbol candidates and 1-bit symbol candidates can be greatly improved, resulting in faster searches that utilize fewer system resources. If heightened accuracy of the distance measurements for the selected 0-bit symbol candidate and the selected 1-bit symbol candidate is desired, then those two specific distance measurements can be refined after the searching step, as described in further detail below.

Figure 8:
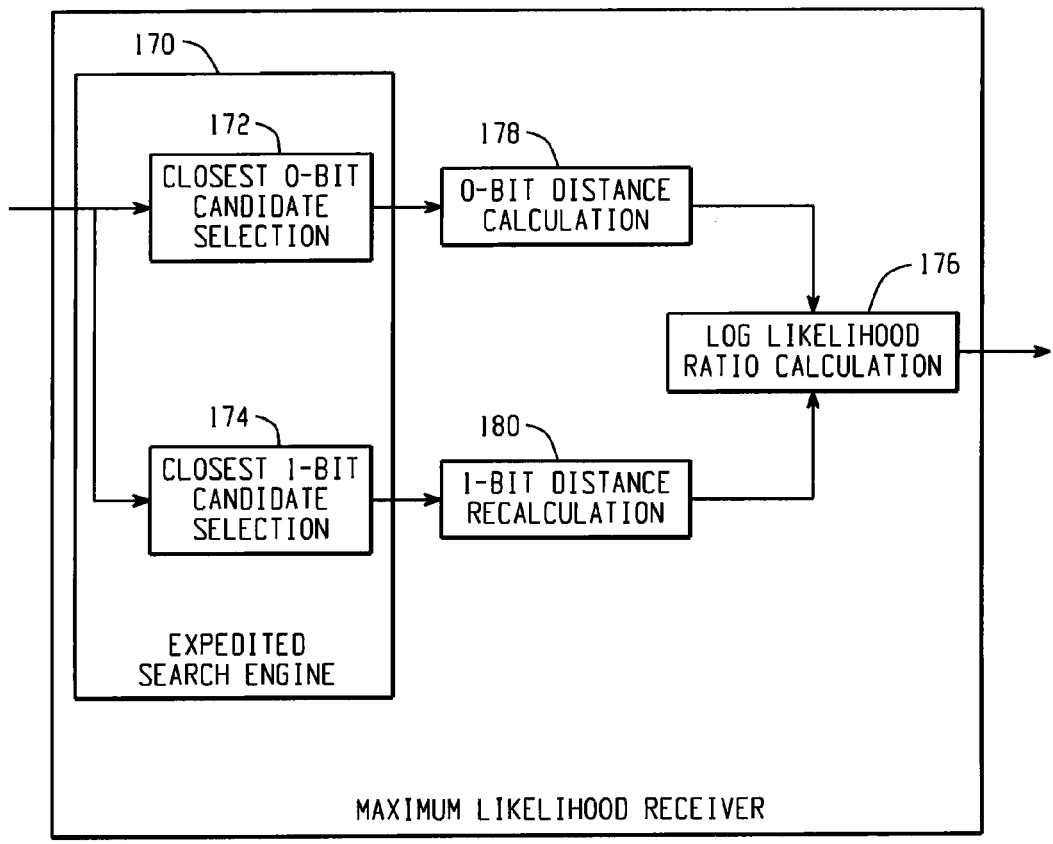
FIG. 8 is a block diagram depicting a log likelihood ratio calculation by a maximum likelihood receiver.

FIG. 8 is a block diagram depicting a log likelihood ratio calculation by a maximum likelihood receiver. A received data signal (e.g., from one stream of a multi-stream signal of a single carrier signal) is provided to the expedited search engine 170. At 172, a symbol selection distance approximation is used to select a closest 0-bit symbol candidate from a plurality of 0-bit symbol candidates (e.g., from the constellation of symbols depicted in FIG. 7). At 174, the symbol selection distance approximation is used to select a closest 1-bit symbol candidate from a plurality of 1-bit symbol candidates. Because the log likelihood calculation 176 that is output from the maximum likelihood receiver utilizes computed distances from the received signal to the selected 0-bit candidate and the selected 1-bit candidate, the distances to those selected candidates, which were roughly calculated at 172 and 174 using the symbol selection distance approximation, may be recalculated at 178 and 180, respectively. The calculations at 178 and 180 may be performed using a different symbol selection distance approximation than was used by the expedited search engine 170, or an exact calculation algorithm, such as a squared Euclidean distance calculation, may be used. In some configurations, such as those where sufficient tolerance is present, the distance calculations made at 172 and 174 as part of the search process may be sufficient for the log likelihood calculation 176, and no additional recalculation may be performed at 178 and 180.

At 176, a log likelihood ratio calculation is performed using the distances determined between the received signal and the selected 0-bit candidate and the selected 1-bit candidate. For example, the log likelihood ratio may be calculated according to $$L(b_k^{(i)}) \approx \frac{1}{\sigma^2}\{\|y - Hx_0\|^2 - \|y - Hx_1\|^2\},$$

where $\|y-Hx_0\|$ is the 0-bit distance calculated between the received signal and the selected 0-bit candidate, $x_0$, where $$x_0 = \arg\min_{x \in X_{k,j}} \|y - Hx\|,$$

and $\|y-Hx_1\|$ is the 1-bit distance calculated between the received signal and the selected 1-bit candidate, $x_1$, where $$x_1 = \arg\min_{x \in X_{k,j}} \|y - Hx\|,$$

where $L(b_k^{(i)})$ is the log likelihood ratio for a bit of interest, and $\sigma^2$ is the variance of the noise.

Figure 9A:
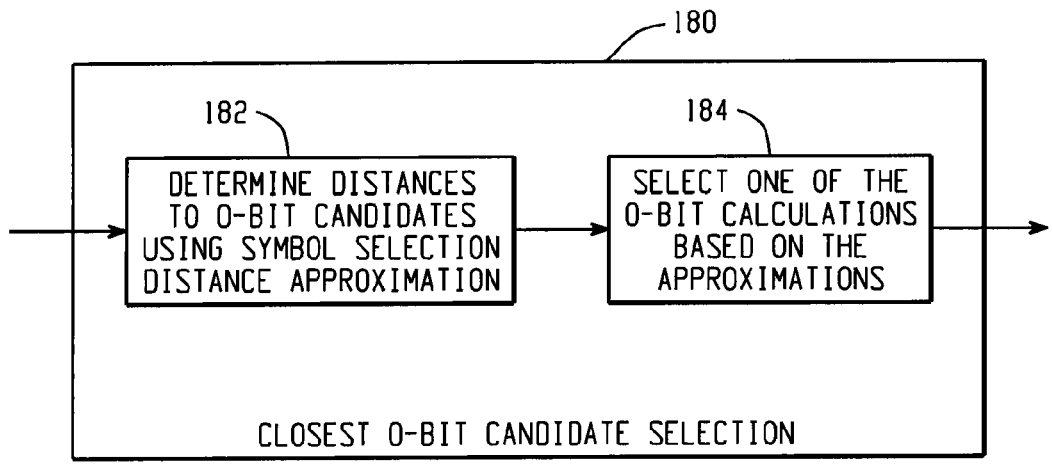
FIGS. 9A and 9B are block diagrams depicting 0-bit and 1-bit candidate selection by an expedited search engine.
Figure 9B:
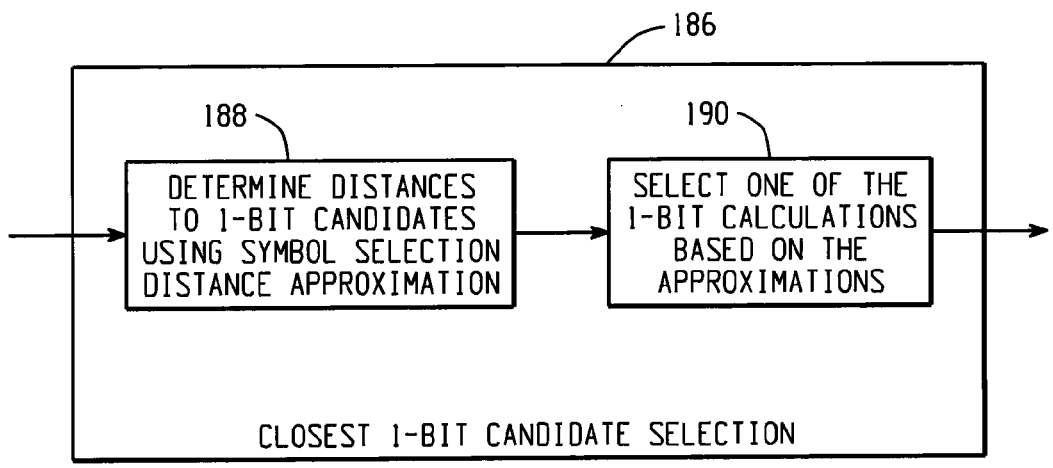

FIGS. 9A and 9B are block diagrams depicting 0-bit and 1-bit candidate selection by an expedited search engine. In selecting a closest 0-bit candidate at 180 in FIG. 9A, distances are determined at 182 between a received data signal and each of a plurality of 0-bit symbol candidates (i.e., symbols having a 0 at the current bit for which a log likelihood ratio is being calculated). Based on the distance determinations, the 0-bit candidate that is estimated to be closest to the received signal is selected at 184 for use in a Max-Log Approximation log likelihood ratio calculation.

In selecting a closest 1-bit candidate at 186 in FIG. 9B, distances are determined at 188 between a received data signal and each of a plurality of 1-bit symbol candidates (i.e., symbols having a 1 at the current bit for which a log likelihood ratio is being calculated). Based on the distance determinations, the 1-bit candidate that is estimated to be closest to the received signal is selected at 190 for use in a Max-Log Approximation log likelihood ratio calculation.

Figure 10:
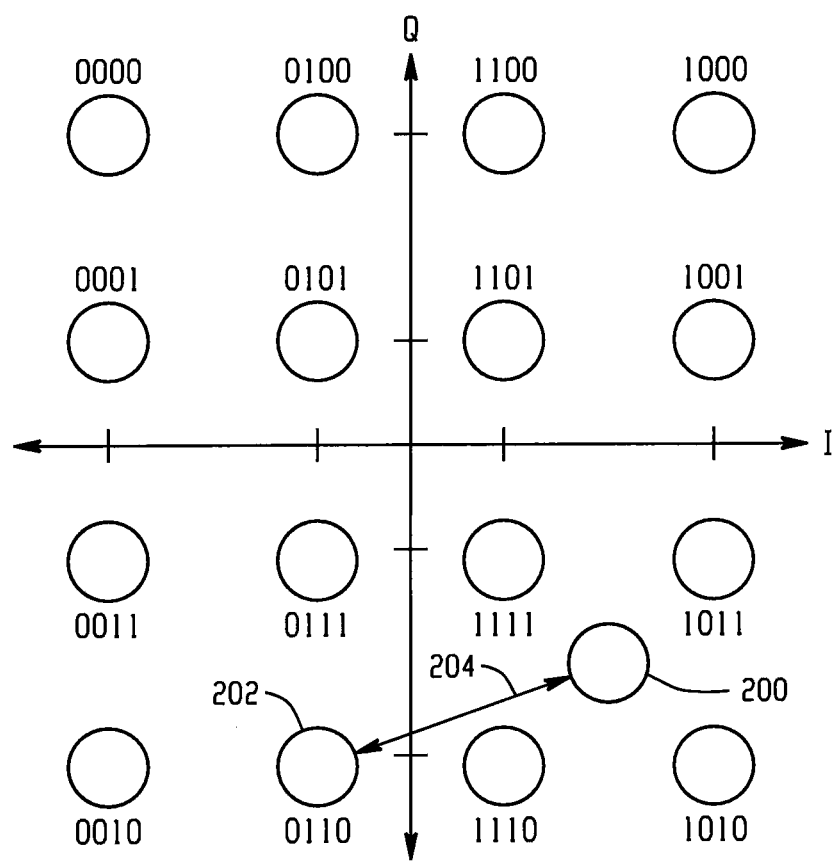
FIG. 10 is a diagram depicting the selection of a 0-bit symbol candidate.

FIG. 10 is a diagram depicting the selection of a 0-bit symbol candidate. Distance calculations between the received signal 200 and each of the eight symbol candidates having a 0 value for the first bit are made using a symbol selection distance approximation. The 0-bit candidate at 202 is identified by the symbol selection distance approximation as being the closest 0-bit candidate. The distance between the received signal 200 and the selected 0-bit candidate is recalculated, as indicated by the solid arrow at 204, and that recalculated distance is used as an input to the log likelihood ratio calculation.

Figure 11:
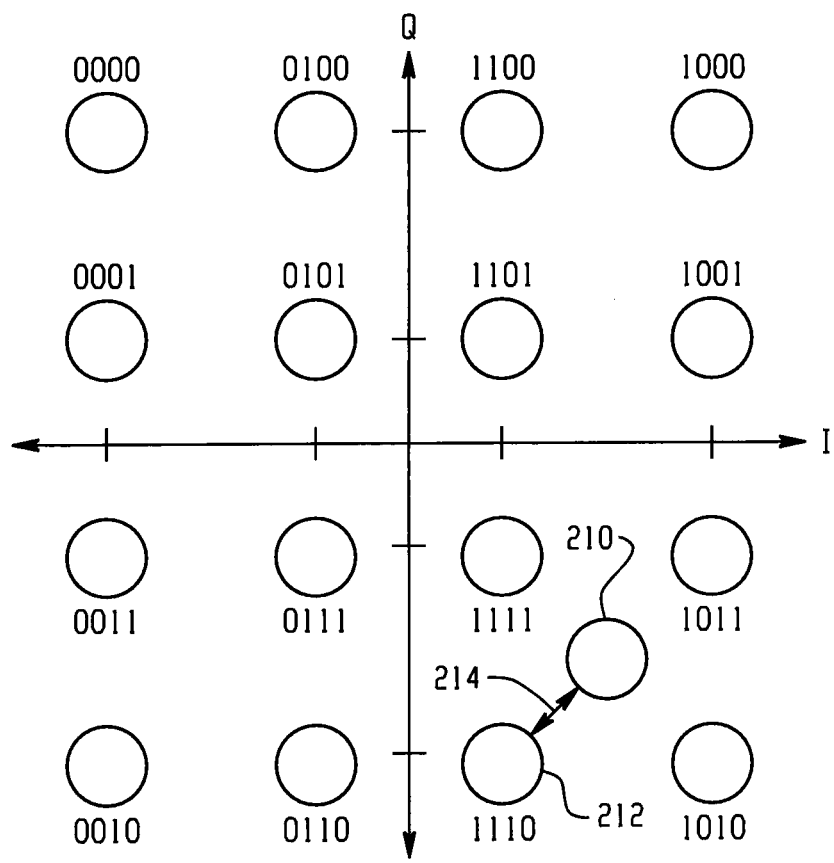
FIG. 11 is a diagram depicting the selection of a 1-bit symbol candidate.

FIG. 11 is a diagram depicting the selection of a 1-bit symbol candidate. Distance calculations between the received signal 200 and each of the eight symbol candidates having a 1 value for the first bit are made using the symbol selection distance approximation. The 1-bit candidate at 212 is identified by the symbol selection distance approximation as being the closest 1-bit candidate. The distance between the received signal 210 and the selected 1-bit candidate is recalculated, as indicated by the solid arrow at 214, and that recalculated distance is used as an input to the log likelihood ratio calculation.

In configurations where symbols are associated with multiple bits (e.g., the symbols depicted in the constellation of FIG. 7), the distance calculations between the received signal and the candidate symbols made at 182 and 188 in FIG. 9 may be saved for use with subsequent bits of the current symbol. For example, for a second bit of a symbol, the selections at 184 and 190 may be made without repeating the distance determinations at 182 and 188, where the set of 0-bit symbol candidates available for selection at 184 changes based on the bit identity at the second bit for each of the candidate symbols available. Similarly, the set of candidate symbols available for selection at 190 is limited to those having a bit value of 1 for the second bit. However, the distances between the received signal and the candidate symbols do not change.

Distance calculations between the received signal and symbol candidates can be performed in a variety of manners. Exact computations can be computed using an exact squared Euclidean calculation. For example, a squared Euclidean distance, $\|z\|^2$, can be calculated for a complex vector of N dimensions, $z = z_{1I} + jz_{1Q}$, $z = z_{2I} + jz_{2Q}$, $z = z_{NI} + jz_{NQ}$, (e.g., vectors from the received signal to each of the N candidate symbols) according to:

$$\|z\|^2 = \sum_{k=1}^{N} |z_{kI}|^2 + \sum_{k=1}^{N} |z_{kQ}|^2.$$

However, such a calculation over the entire set of candidate symbols is resource and time intensive.

To alleviate the complexity involved with providing exact squared Euclidean difference calculations during the search phase where closest 0-bit and 1-bit candidates are selected, a symbol selection distance approximation may be used during the search phase. For example, certain symbol selection distance approximations utilize a normal approximation for a complex-valued scalar (e.g., representing a vector from a received signal and a candidate symbol), $z_k = z_{kI} + jz_{kQ}$, where the norm approximation of $\|z_k\|$ estimates $\|z_k\| = \max\{|z_{kI} + jz_{kQ}|\} + \alpha \cdot \min\{|z_{kI}|, |z_{kQ}|\}$, where $\alpha$ is a constant (e.g., 5/16).

Using the above described norm approximation, a non-iterative distance approximation for $\|z\|$ can be calculated as follows.

$$\|z\| \approx G(z),$$

where $$G(z) = \sum_{k=1}^{N} g(z_k),$$

where $$g(z_k) = \max\{|z_{kI}|, |z_{kQ}|\} + \alpha \cdot \min\{|z_{kI}|, |z_{kQ}|\}, \ k=1 \ldots N.$$

The non-iterative distance approximation can be used to provide a fast estimate of distances between the received signal and each of the candidate symbols of interest.

An iterative distance approximation can also be utilized. The iterative distance approximation may provide more accurate results when compared to the non-iterative alternative described above, at the cost of some computational complexity. The non-iterative distance approximation can be calculated according to:

$$\|z\| \approx \breve{G}(z)^{(N)},$$

where $$\breve{G}(z)^{(1)} = g(z_1),$$

where $$\breve{G}(z)^{(k)} = \max\{g(z_k), G(z)^{(k-1)}\} + \alpha \cdot \min\{g(z_k), G(z)^{(k-1)}\},$$
$$k=2 \ldots N,$$

where $$g(z_k) = \max\{|z_{kI}|, |z_{kQ}|\} + \alpha \cdot \min\{|z_{kI}|, |z_{kQ}|\}, \ k=1 \ldots N.$$

Upon selection of the 0-bit and 1-bit symbol candidates using the symbol selection distance approximation (e.g., the iterative distance approximation or the non-iterative distance approximation), the distances for the selected symbol candidates may or may not be recalculated. If the distances are not recalculated, then the distance determined during the search phase is used for the log likelihood ratio calculation. If the distances are recalculated, then a different distance approximation may be used, or an exact distance calculation algorithm may be used. Example combinations of search phase symbol selection distance approximation methods and log-likelihood distance calculation sources include:

| Search Phase | Log-Likelihood Ratio Phase |
| --- | --- |
| Non-iterative Distance Approximation | Non-iterative Distance Approximation |
| Non-iterative Distance Approximation | Iterative Distance Approximation |
| Non-iterative Distance Approximation | Squared Euclidean Distance Calculation |
| Iterative Distance Approximation | Iterative Distance Approximation |
| Iterative Distance Approximation | Non-iterative Distance Approximation |
| Iterative Distance Approximation | Squared Euclidean Distance Calculation |

Figure 12:
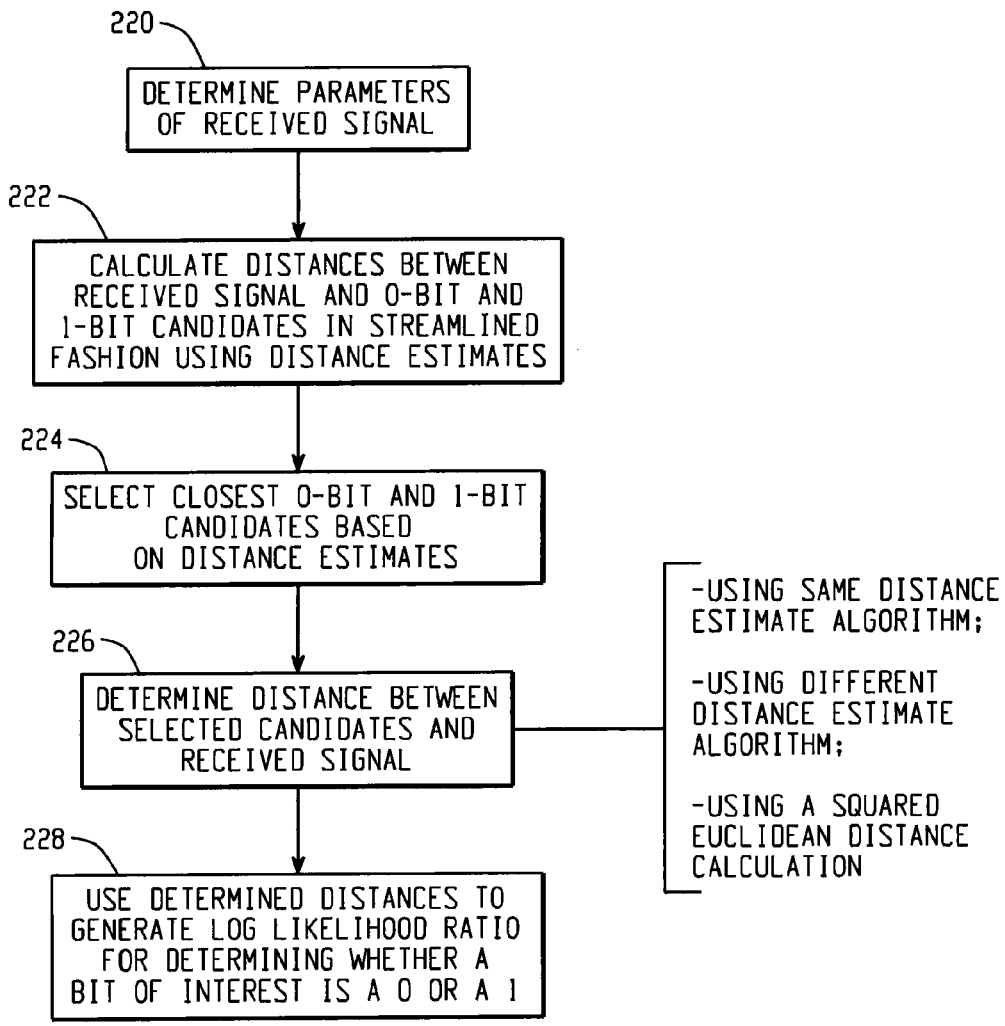
FIG. 12 is a flow diagram depicting an example method for calculating a log likelihood ratio for a bit of interest.

FIG. 12 is a flow diagram depicting an example method for calculating a log likelihood ratio for a bit of interest. At 220, parameters of the received signal are determined, such as a determination of coordinates that are representative of the received signal. At 222, distances are calculated between the received signal and 0-bit and 1-bit candidates. The distances are calculated in a streamlined fashion using distance estimates. At 224, closest 0-bit and 1-bit candidates are selected based on the distance metrics. Distances are determined at 226 between the received signal and the selected 0-bit and 1-bit candidates. The distances may be determined using the same algorithm as the estimates determined at 222, a different algorithm may be used to generate estimates, or an exact distance calculate may be computed. At 228, the determined distances are used to generate a log likelihood ratio for use in determining whether a bit of interest is a 0 or 1.

Figure 13A:
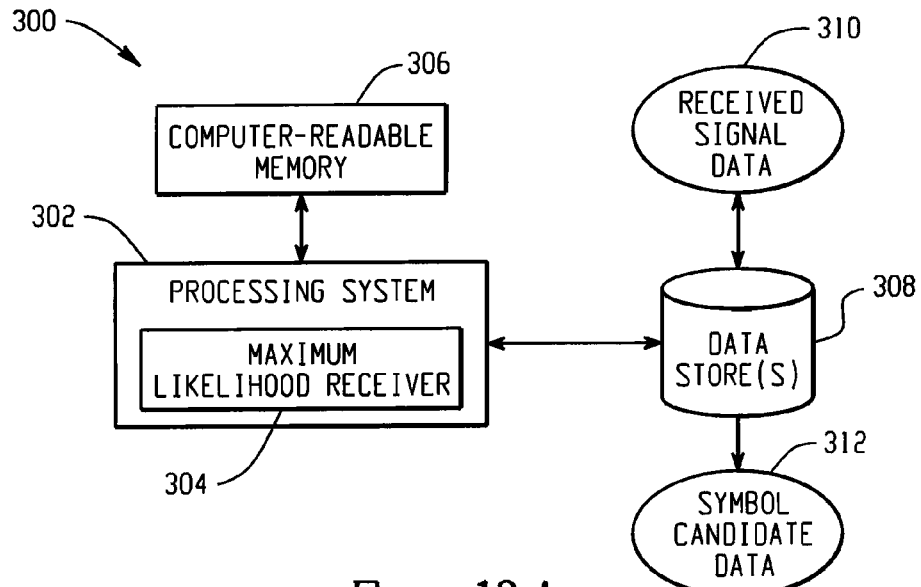
FIGS. 13A, 13B, and 13C depict examples of systems for use in implementing a maximum likelihood receiver.
Figure 13B:
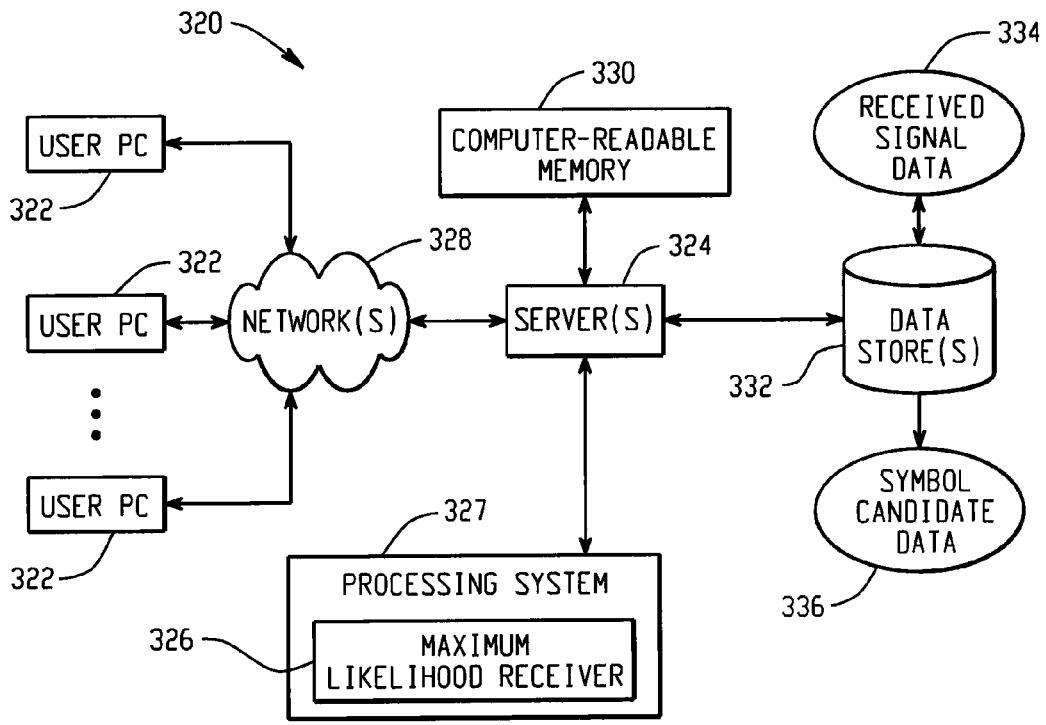
Figure 13C:
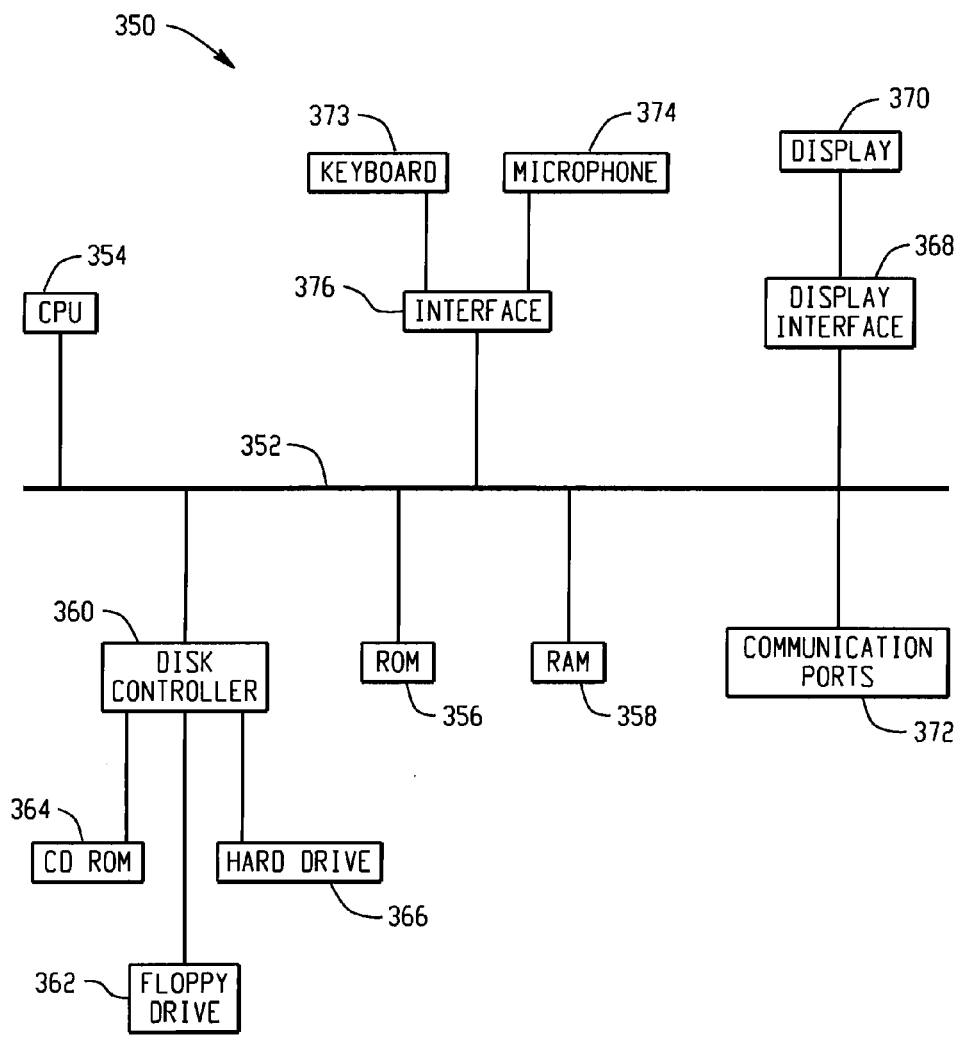

FIGS. 13A, 13B, and 13C depict examples of systems for use in implementing a maximum likelihood receiver. For example, FIG. 13A depicts an example of a system 300 that includes a standalone computer architecture where a processing system 302 (e.g., one or more computer processors) includes a maximum likelihood receiver 304 being executed on it. The processing system 302 has access to a computer-readable memory 306 in addition to one or more data stores 308. The one or more data stores 308 may include received signal data 310 as well as symbol candidate data 312.

FIG. 13B depicts a system 320 that includes a client server architecture. One or more user PCs 322 access one or more servers 324 running a maximum likelihood receiver 326 on a processing system 327 via one or more networks 328. The one or more servers 324 may access a computer readable memory 330 as well as one or more data stores 332. The one or more data stores 332 may contain received signal data 334 as well as symbol candidate data 336.

FIG. 13C shows a block diagram of an example of hardware for a standalone computer architecture 350, such as the architecture depicted in FIG. 13A that may be used to contain and/or implement the program instructions of system embodiments of the present invention. A bus 352 may connect the other illustrated components of the hardware. A processing system 354 labeled CPU (central processing unit) (e.g., one or more computer processors), may perform calculations and logic operations required to execute a program. A processor-readable storage medium, such as read only memory (ROM) 356 and random access memory (RAM) 358, may be in communication with the processing system 354 and may contain one or more programming instructions for performing the method of implementing a maximum likelihood receiver. Optionally, program instructions may be stored on a computer readable storage medium such as a magnetic disk, optical disk, recordable memory device, flash memory, or other physical storage medium.

A disk controller 360 interfaces one or more optional disk drives to the system bus 352. These disk drives may be external or internal floppy disk drives such as 362, external or internal CD-ROM, CD-R, CD-RW or DVD drives such as 364, or external or internal hard drives 366. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 360, the ROM 356 and/or the RAM 358. Preferably, the processor 354 may access each component as required.

A display interface 368 may permit information from the bus 352 to be displayed on a display 370 in audio, graphic, or alphanumeric format. Communication with external devices may optionally occur using various communication ports 372.

In addition to the standard computer-type components, the hardware may also include data input devices, such as a keyboard 373, or other input device 374, such as a microphone, remote control, pointer, mouse and/or joystick.

This written description uses examples to disclose the invention, including the best mode, and also to enable a person skilled in the art to make and use the invention. The patentable scope of the invention may include other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

The invention claimed is:

1. A method of determining a data value for a bit of interest in a received data signal, the method comprising:
    selecting a closest 0-bit symbol candidate, at the bit of interest, from a plurality of 0-bit symbol candidates using a symbol selection distance approximation;
    selecting a closest 1-bit symbol candidate, at the bit of interest, from a plurality of 1-bit symbol candidates using the symbol selection distance approximation;
    calculating a 0-bit distance and a 1-bit distance, wherein the 0-bit distance represents the distance between the received data signal and the selected closest 0-bit symbol candidate, and the 1-bit distance represents the distance between the received data signal and the selected closest 1-bit symbol candidate;
    calculating a log likelihood ratio for the bit of interest using i) the calculated 0-bit distance and ii) the calculated 1-bit distance; and
    determining the data value for the bit of interest based on the calculated log likelihood ratio;
    wherein locations of each of the received data signal, the plurality of 0-bit symbol candidates, and the plurality of 1-bit symbol candidates are identified by coordinates;
    wherein the symbol selection distance approximation, as applied to selecting the closest 0-bit symbol candidate, includes
        estimating first distances between the received data signal and the plurality of 0-bit symbol candidates using norm approximations of vectors from the coordinates of the received data signal to coordinates of the plurality of 0-bit symbol candidates,
    wherein the symbol selection distance approximation, as applied to selecting the closest 1-bit symbol candidate, includes
        estimating second distances between the received data signal and the plurality of 1-bit symbol candidates using norm approximations of vectors from the coordinates of the received data signal to coordinates of the plurality of 1-bit symbol candidates,
    wherein the vector between the coordinates of the received data signal and the coordinates of a 0-bit or 1-bit symbol candidate is represented as $z_k = z_{kI} + j z_{kQ}$,
    wherein the norm approximation of $\|z_k\|$ estimates $\|z_k\| = \max\{|z_{kI}|, |z_{kQ}|\} + \alpha \cdot \min\{|z_{kI}|, |z_{kQ}|\}$, where $\alpha$ is 5/16, and
    wherein the first or second distances are calculated according to a non-iterative distance approximation according to:
$$\|z\| \approx G(z),$$
where
$$G(z) = \sum_{k=1}^{N} g(z_k),$$
where
$$g(z_k) = \max\{|z_{kI}|, |z_{kQ}|\} + \alpha \cdot \min\{|z_{kI}|, |z_{kQ}|\}, \; k=1\ldots N.$$

2. A method of determining a data value for a bit of interest in a received data signal, the method comprising:
    selecting a closest 0-bit symbol candidate, at the bit of interest, from a plurality of 0-bit symbol candidates using a symbol selection distance approximation;
    selecting a closest 1-bit symbol candidate, at the bit of interest, from a plurality of 1-bit symbol candidates using the symbol selection distance approximation;
    calculating a 0-bit distance and a 1-bit distance, wherein the 0-bit distance represents the distance between the received data signal and the selected closest 0-bit symbol candidate, and the 1-bit distance represents the distance between the received data signal and the selected closest 1-bit symbol candidate;
    calculating a log likelihood ratio for the bit of interest using i) the calculated 0-bit distance and ii) the calculated 1-bit distance; and
    determining the data value for the bit of interest based on the calculated log likelihood ratio;
    wherein locations of each of the received data signal, the plurality of 0-bit symbol candidates, and the plurality of 1-bit symbol candidates are identified by coordinates;
    wherein the symbol selection distance approximation, as applied to selecting the closest 0-bit symbol candidate, includes
        estimating first distances between the received data signal and the plurality of 0-bit symbol candidates using norm approximations of vectors from the coordinates of the received data signal to coordinates of the plurality of 0-bit symbol candidates,
    wherein the symbol selection distance approximation, as applied to selecting the closest 1-bit symbol candidate, includes
        estimating second distances between the received data signal and the plurality of 1-bit symbol candidates using norm approximations of vectors from the coordinates of the received data signal to coordinates of the plurality of 1-bit symbol candidates,
    wherein the vector between the coordinates of the received data signal and the coordinates of a 0-bit or 1-bit symbol candidate is represented as $z_k = z_{kI} + j z_{kQ}$,
    wherein the norm approximation of $\|z_k\|$ estimates $\|z_k\| = \max\{|z_{kI}|, |z_{kQ}|\} + \alpha \cdot \min\{|z_{kI}|, |z_{kQ}|\}$, where $\alpha$ is 5/16, and
    wherein the first or second distances are calculated according to an iterative distance approximation according to:
$$\|z\| \approx \check{G}(z)^{(N)},$$
where
$$\check{G}(z)^{(1)} = g(z_1),$$
where
$$\check{G}(z)^{(k)} = \max\{g(z_k), \check{G}(z)^{(k-1)}\} + \alpha \cdot \min\{g(z_k), \check{G}(z)^{(k-1)}\},$$
$$k=2\ldots N,$$

where $$g(z_k) = \max\{|z_{kI}|, |z_{kQ}|\} + \alpha \cdot \min\{|z_{kI}|, |z_{kQ}|\}, \quad k = 1 \ldots N.$$

3. The method of claim 1, wherein the plurality of 0-bit symbol candidates are symbols having a 0 value for the bit of interest, and wherein the plurality of 1-bit symbol candidates are symbols having a 1 value for the bit of interest.

4. The method of claim 1, wherein selecting a closest 0-bit symbol candidate includes:
  determining the first distances between the received data signal and each of the plurality of 0-bit symbol candidates, wherein the first distances are determined using the symbol selection distance approximation; and
  selecting one of the 0-bit symbol candidates based on the determined first distances.

5. The method of claim 1, wherein selecting a closest 1-bit symbol candidate includes:
  determining the second distances between the received data signal and each of the plurality of 1-bit symbol candidates, wherein the second distances are determined using the symbol selection distance approximation; and
  selecting one of the 1-bit symbol candidates based on the determined second distances.

6. The method of claim 1, wherein the 0-bit distance and the 1-bit distance are calculated using the symbol selection distance approximation.

7. The method of claim 1, wherein the 0-bit distance and the 1-bit distance are further calculated using a second distance approximation that is different from the symbol selection distance approximation.

8. The method of claim 1, wherein the 0-bit distance and the 1-bit distance are calculated using a squared Euclidean distance calculation.

9. The method of claim 1, wherein the symbol selection distance approximation uses an iterative distance approximation or a non-iterative distance approximation; and
  wherein the 0-bit distance or the 1-bit distance are calculated using the iterative distance approximation, the non-iterative distance approximation, or a squared Euclidean distance calculation.

10. The method of claim 9, wherein the squared Euclidean distance calculation calculates a distance for a complex vector of dimension N according to:

$$\|z\|^2 = \Sigma_{k=1}^{N} |z_{kI}|^2 + \Sigma_{k=1}^{N} |z_{kQ}|^2.$$

11. The method of claim 1, wherein the first distances between the received data signal and the plurality of 0-bit symbol candidates are used to select the 0-bit symbol candidate that fulfills $$x_0 = \arg\min_{x \in X_{k,j}} \|y - Hx\|^2,$$

where y represents the received signal, H represents a channel effect, and x represents 0-bit symbol candidates having a 0 at the bit of interest; and
wherein the second distances between the received data signal and the plurality of 1-bit symbol candidates are used to select the 1-bit symbol candidate that fulfills $$x_1 = \min_{x \in X_{k,j}} \|y - Hx\|^2,$$

where x represents 1-bit symbol candidates having a 1 at the bit of interest.

12. The method of claim 11, wherein the log likelihood ratio is calculated according to:

$$L(b_k^{(i)}) \approx 1/\sigma^2 \{\|y - Hx_0\|^2 - \|y - Hx_1\|^2\},$$

where $\|y - Hx_0\|$ is the 0-bit distance, $\|y - Hx_1\|$ is the 1-bit distance, $L(b_k^{(i)})$ is the log likelihood ratio for a bit of interest, and $\sigma^2$ is a variance of noise.

13. The method of claim 12, wherein the bit of interest is determined to be as 0 or a 1 based on the log likelihood ratio.

14. The method of claim 1, wherein the received data signal is a multiple input, multiple output (MIMO) signal.

15. The method of claim 1, wherein the received data signal is a single carrier signal.

16. The method of claim 2, wherein the plurality of 0-bit symbol candidates are symbols having a 0 value for the bit of interest, and wherein the plurality of 1-bit symbol candidates are symbols having a 1 value for the bit of interest.

17. The method of claim 2, wherein selecting a closest 0-bit symbol candidate includes:
  determining the first distances between the received data signal and each of the plurality of 0-bit symbol candidates, wherein the first distances are determined using the symbol selection distance approximation; and
  selecting one of the 0-bit symbol candidates based on the determined first distances.

18. The method of claim 2, wherein selecting a closest 1-bit symbol candidate includes:
  determining the second distances between the received data signal and each of the plurality of 1-bit symbol candidates, wherein the second distances are determined using the symbol selection distance approximation; and
  selecting one of the 1-bit symbol candidates based on the determined second distances.

19. The method of claim 2, wherein the 0-bit distance and the 1-bit distance are calculated using the symbol selection distance approximation.

20. The method of claim 2, wherein the 0-bit distance and the 1-bit distance are further calculated using a second distance approximation that is different from the symbol selection distance approximation.

21. The method of claim 2, wherein the 0-bit distance and the 1-bit distance are calculated using a squared Euclidean distance calculation.

22. The method of claim 2, wherein the symbol selection distance approximation uses an iterative distance approximation or a non-iterative distance approximation; and
  wherein the 0-bit distance or the 1-bit distance are calculated using the iterative distance approximation, the non-iterative distance approximation, or a squared Euclidean distance calculation.

23. The method of claim 22, wherein the squared Euclidean distance calculation calculates a distance for a complex vector of dimension N according to:

$$\|z\|^2 = \Sigma_{k=1}^{N} |z_{kI}|^2 + \Sigma_{k=1}^{N} |z_{kQ}|^2.$$

24. The method of claim 2, wherein the first distances between the received data signal and the plurality of 0-bit symbol candidates are used to select the 0-bit symbol candidate that fulfills $$x_0 = \arg\min_{x \in X_{k,j}} \|y - Hx\|^2,$$

where y represents the received signal, H represents a channel effect, and x represents 0-bit symbol candidates having a 0 at the bit of interest; and wherein the second distances between the received data signal and the plurality of 1-bit symbol candidates are used to select the 1-bit symbol candidate that fulfills $$x_1 = \min_{x \in X_{k,j}} \|y - Hx\|^2,$$

where x represents 1-bit symbol candidates having a 1 at the bit of interest.

25. The method of claim 24, wherein the log likelihood ratio is calculated according to:

$$L(b_k^{(i)}) \approx 1/\sigma^2 \{\|y-Hx_0\|^2 - \|y-Hx_1\|^2\},$$

where $\|y-Hx_0\|$ is the 0-bit distance, $\|y-Hx_1\|$ is the 1-bit distance, $L(b_k^{(i)})$ is the log likelihood ratio for a bit of interest, and $\sigma^2$ is a variance of noise.

26. The method of claim 25, wherein the bit of interest is determined to be a 0 or a 1 based on the log likelihood ratio.

27. The method of claim 2, wherein the received data signal is a multiple input, multiple output (MIMO) signal.

28. The method of claim 2, wherein the received data signal is a single carrier signal.

* * * * *